United States Patent [19]
Brown

[11] 4,079,308
[45] Mar. 14, 1978

[54] RESISTOR RATIO CIRCUIT CONSTRUCTION

[75] Inventor: George W. Brown, San Jose, Calif.

[73] Assignee: Advanced Micro Devices, Inc., Sunnyvale, Calif.

[21] Appl. No.: 763,861

[22] Filed: Jan. 31, 1977

[51] Int. Cl.² ............................................. G05F 1/50
[52] U.S. Cl. ........................................ 323/1; 29/593;
29/610 R; 323/22 T; 338/320; 307/297
[58] Field of Search ................ 323/1, 4, 9.22 T, 94 R;
338/320, 48; 307/296, 297; 29/610 R, 620, 593

[56] References Cited
U.S. PATENT DOCUMENTS

| | | | |
|---|---|---|---|
| 3,886,435 | 5/1975 | Steckler | 323/9 |
| 3,916,508 | 11/1975 | Conzelmann et al. | 29/610 R |
| 3,940,683 | 2/1976 | Blauschild | 323/4 |
| 4,032,839 | 6/1977 | Ahmed | 307/297 |

Primary Examiner—Gerald Goldberg

[57] ABSTRACT

A circuit and method for providing a desired resistor ratio whereby an output voltage may be derived across one of the members of the ratio pair. A voltage regulator is connected between first and second resistors of the ratio pair to provide voltage compensation partially dependent on third and fourth resistors within the regulator such that the error in each of the resistances of the desired ratio pair is cancelled by matching errors in the third and fourth resistances of the voltage regulator.

10 Claims, 2 Drawing Figures

RESISTOR RATIO CIRCUIT CONSTRUCTION

BACKGROUND OF THE INVENTION a. Field of the Invention

The invention relates to the construction of resistor ratios, and more particularly to a circuit for use in integrated circuits in achieving a desired resistor ratio.

b. Prior Art

In the manufacture of integrated circuits, resistor ratios are frequently provided wherein a first resistor of a ratio pair is constructed during one processing step, while a second member of the pair is constructed during a second processing step. Because of variations in the processing steps necessary to accommodate other circuit elements being manufactured during the same processing steps, the errors in the resistance values differ from each other and do not cancel when the final ratio pair is formed. Moreover, construction of the desired resistor ratio is not repeatable because even the same process steps vary significantly from one operation to the next.

One approach to constructing desired resistor ratios is to minimize processed induced changes by optimizing the resistor geometry. Such an approach is described in U.S. Pat. No. 3,771,095 granted Nov. 6, 1973. This patent teaches the use of geometries which have different, rather than the same, widths. While this is an interesting approach, it is considered to be good manufacturing practice that resistors which must conform to a desired ratio must also be of similar length and width in integrated circuit construction.

U.S. Pat. No. 3,659,121, issued Apr. 25, 1972 teaches that widely varying resistor ratios impose a severe area penalty in integrated circuit construction and that the problem may be solved by providing a constant current source generating a very small current. This obviates the need for a large resistor of a ratio pair. This is of some interest where the resistors of the ratio pair do not form a voltage divider. However, where a voltage divider is contemplated, both members of the ratio pair are necessary.

It is the object of the present invention to devise a construction for a resistor ratio pair and to compensate for errors in the ratio pair. It is a further object of the invention to provide a circuit which maintains a predictable voltage across a load resistor of a resistor ratio pair.

SUMMARY OF THE INVENTION

The above objects are achieved in a circuit which provides a desired ratio between first and second resistors forming the pair. A transistor current source is connected between the first and second resistors for supplying current to one of them. The current source includes a control electrode or input port to which a voltage regulator is connected. The voltage supplied by the regulator is dependent on the value of third and fourth resistors within the regulator in a manner such that the voltage across one of the members of the resistor ratio pair is in proportion to the ratio of the values of the first and fourth resistors multiplied by a second ratio comprising the values of the third and second resistors. The first and fourth resistors have values deviating from desired values by the same amount and the third and second resistors have values deviating from desired values by the same amount, thereby causing errors to cancel each other. Error cancellation is achieved by manufacturing the first and fourth resistors in the same manufacturing step such that the same deviations from ideal values occur simultaneously. A similar manufacturing operation is used for the third and second resistors.

DESCRIPTION OF THE PREFERRED EMBODIMENT

Figure 1:
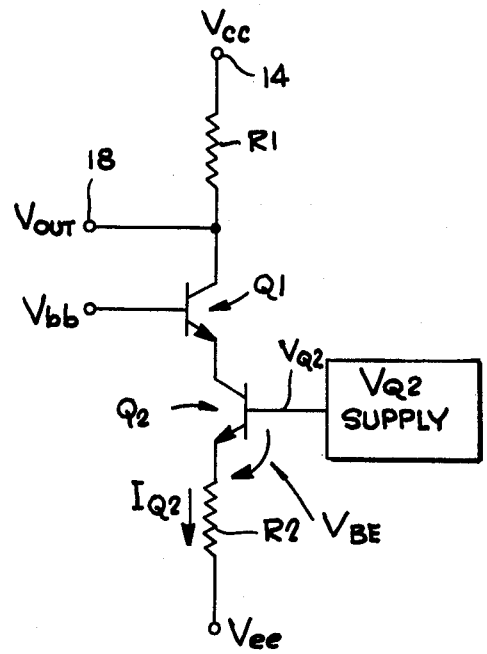
FIG. 1 is a simplified schematic of the circuit construction of the present invention.

With reference to FIG. 1, a pair of resistors R1, R2 is to be constructed in an integrated circuit forming a ratio pair. In the present invention, an active current supply Q1 and Q2, supplies a current which defines the voltage across the resistor R2. This current source provides a means for correcting errors in the resistance of R2, thereby correcting errors in the resistor ratio between R1 and R2.

The transistors Q1 and Q2 form an active current supply with the transistor Q2 acting as a current source and the transistor Q1 as a gain stage with respect to currents supplied to resistor R2. The control current supplied to resistor R2 is labeled $I_{Q2}$ in FIG. 1 and, as mentioned previously, serves to correct the resistance of R2 in the ratio pair comprising R1 and R2.

The output voltage, $V_{out}$, is taken at a node 18 near an end of resistor R1 and the output voltage, $V_{out}$, is measured with respect to the supply voltage $V_{cc}$ at terminal 14. The output voltage, $V_{out}$, is a function of the resistor ratio R1/R2, the base to emitter drop, $\phi2$ of the transistor Q2 and the magnitude of the supply voltage $V_{Q2}$ to the base electrode of the transister Q2, as well as the current gain of the transistors. The value of the supply voltage $V_{Q2}$ is typically between 400 and 800 millivolts greater than the base to emitter voltage of transistor Q2. The difference between the voltage supply $V_{Q2}$ and the base emitter voltage, $V_{BE}$, of transistor Q2 define the voltage across resistor R2 and hence the current $I_{Q2}$ through that resistor. If the bias supply of Q2, $V_{Q2}$, and the base-emitter voltage of Q2, $\phi2$, are relatively constant, then the output voltage of the circuit of FIG. 1, $V_{out}$ as defined between $V_{cc}$ and node 18, is a strong function of the resistor ratio R1/R2.

The value of the bias supply voltage for Q2, $V_{Q2}$, is regulated to compensate for errors in the resistor ratio and to maintain a reasonably constant voltage across resistor R1. This allows the ratio to vary but to be compensated for by the regulation provided by the $V_{Q2}$ supply.

Figure 2:
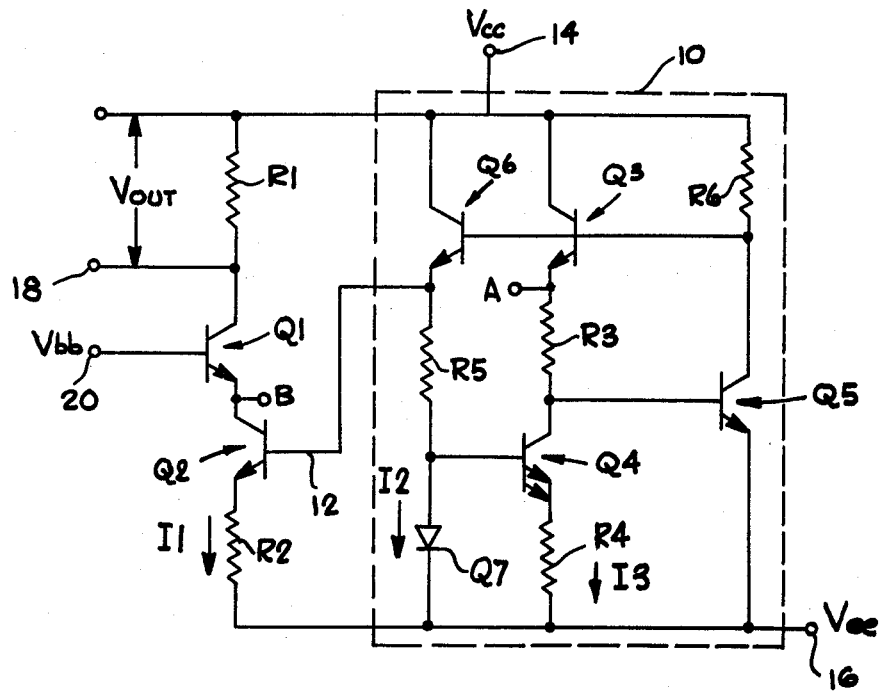
FIG. 2 is a schematic of the circuit construction of the present invention.

The constant $V_{Q2}$ supply is provided in the circuit shown in FIG. 2. The voltage regulator of FIG. 2 resembles an Owens voltage regulator, described in U.S. Pat. No. 3,781,648, granted to Owens on Dec. 15, 1973. The aforementioned patent is incorporated by reference herein and a circuit quite similar to the circuit shown in FIG. 2 of that patent is indicated by the dashed line 10.

A significant feature of the voltage regulator shown in FIG. 2 is the resistor R3 in the emitter circuit of transistor Q3 and the resistor R4 in the emitter circuit of transistor Q4. Resistor R3 is a third resistor and resistor R4 is a fourth resistor to be used in correcting the error in the first and second resistors R1 and R2 forming the desired ratio pair. It has been discovered that by manufacturing the resistances R1 and R4 simultaneously during one processing step and manufacturing the third and second resistors simultaneously during another processing step, the resistors which are manufactured simultaneously during the same processing step will tend to deviate from said desired values by the same amount. This simultaneous manufacture of resistances is referred to as "matching". Note that matching does not refer to equality of resistor values, but to equality of percentage of error deviation from desired value.

In FIG. 2 it will be seen that the regulator supply is provided to bias line 12, connected to the base of transistor Q2. Both the transistor current sources for resistor R1, formed by transistors Q1 and the gain of Q2, as well as the $V_{Q2}$ supply within the dashed line 10 are connected to a common terminal 14 wherein a positive voltage, $V_{cc}$ is connected and another terminal 16 wherein a negative voltage $V_{ee}$ is connected. The output voltage $V_{out}$ is taken at terminal 18 and, as previously mentioned, is measured with respect to $V_{cc}$. A bias supply $V_{bb}$ is connected to terminal 20 which is in turn connected to the base of transistor Q1. This bias supply is intended to keep transistor Q1 on. Q1 in this illustration is used in place of active circuitry which is normally located there for simplification.

Within the regulated supply within dashed line 10, the transistors Q3 and Q6 can be seen to be connected to the supply terminal 14 and then to resistors R3 and R5 in mutually parallel circuit branches. A transistor Q4 joins the two branches with the collector of Q4 being connected to resistor R3 and with the base of Q4 being connected to resistor R5. A collector shorted to base diode Q7 is connected from the base of Q4 to ground, $V_{ee}$, while the resistor R4 is connected between the emitter of Q4 to the negative terminal 16. A third circuit branch between the positive supply terminal 14 and the negative supply terminal 16 is the resistor R6 and the transistor Q5. The base of Q5 is connected to collector of Q4.

The voltage across R4 is the difference in the base to emitter voltages of Q7 and Q4. The current density through the diode Q7 is made greater than the current density through transistor Q4 such that the base-emitter voltage difference between the two can be defined as:

$$\Delta V_{be|Q4-Q7|} \simeq \frac{kT}{q} \ln \frac{J7}{J4} \tag{1}$$

where $V_{BE(Q4-Q7)}$ is the base-emitter voltage difference between Q4 and Q7 which is dropped across R4, and
$k$ is Boltzmann's constant
$T$ is the absolute temperature in degrees Kelvin
$q$ is the electronic charge on an electron
$J_4$ is the current density through Q4
$J_7$ is the current density through Q7

Second order resistance effects are ignored and the current $I_3$ is:

$$I_3 = \frac{\Delta V_{be|Q4-Q7|}}{R4} = \left(\frac{1}{R4}\right) \frac{kT}{q} \ln \frac{J7}{J4} \tag{2}$$

and the voltage across R3 is approximately $$V_{R3} \simeq I_3(R3) \simeq \frac{kT}{q} \frac{R3}{R4} \ln \frac{J7}{J4} = \frac{R3}{R4} \left(\frac{kT}{q}\right) \ln \left[\frac{I2}{I3} \frac{Ae4}{Ae7}\right] \tag{3}$$

where Ae means area of emitter (current density J is inversely proportional to emitter area).

The voltage at node A can then be defined as the summation of the voltage drop across R3 and the base-emitter voltage of Q5 or $\phi_{Q5}$.

$$V_A = \phi_{Q5} + \frac{R3}{R4}\left(\frac{kT}{q}\right)\ln\left[\frac{I2}{I3} \frac{Ae4}{Ae7}\right] \tag{4}$$

The base-emitter voltage of Q6 is made equal to the base-emitter voltage of Q3 ($\phi_3 - \phi_6 = 0$), then the current source voltage $V_{Q2}$, is equal to the voltage at node A or $$V_{Q2} = \phi_5 + \frac{R3}{R4}\left(\frac{kT}{q}\right)\ln\left[\frac{I2}{I3} \frac{Ae4}{Ae7}\right] \tag{5}$$

As discussed earlier, the voltage across the current source resistor, R2, is defined by $V_{Q2} - \phi_{Q2}$ where $\phi_{Q2}$ is the base-emitter voltage of transistor Q2.

$$I1 = \frac{V_{Q2} - \phi_{Q2}}{R2} = \tag{6}$$

$$\frac{1}{R2}\left\{\phi_{Q5} - \phi_{Q2} + \frac{R3}{R4}\left(\frac{kT}{q}\right)\ln\left[\frac{I2}{I3} \frac{Ae4}{Ae7}\right]\right\}$$

Now because transistors Q5 and Q2 are made to have similar base-emitter voltages, $$\phi_{Q5} \simeq \phi_{Q2} \tag{7}$$

we can assume their respective base emitter voltages cancel, $\phi_{Q5} - \phi_{Q2} = 0$.

$$I1 = \frac{1}{R2}\left(\frac{R3}{R4}\left(\frac{kT}{q}\right)\ln\left[\frac{I2}{I3} \frac{Ae4}{Ae7}\right]\right) \tag{8}$$

and $V_{out}$ is:

$$V_{OUT} = \alpha^2 \left(\frac{R1}{R2}\right)\left(\frac{R3}{R4}\right)\left(\frac{kT}{q}\right)\ln\left[\frac{I2}{I3} \frac{Ae4}{Ae7}\right] \tag{9}$$

where $\alpha$ = the common base current gain of the transistors Q1 and Q2.

Resistor R3 is manufactured in the same masking and diffusion or implant steps as R2 and the resistor R4 is manufactured in the same masking and diffusion or implant steps as the resistor R1, then R1/R4 will maintain a ratio to R3/R2

$$V_{OUT} = \alpha^2 \left(\frac{R1}{R4}\right)\left(\frac{R3}{R2}\right)\left(\frac{kT}{q}\right)\ln\left[\frac{I2}{I3} \frac{Ae4}{Ae7}\right] \tag{10}$$

From the above it can be seen that the voltage regulator means defined within the dashed line 10 includes third and fourth resistors R3 and R4, respectively. The regulator means is connected to the voltage input port, line 12, which is connected to the transistor Q2, which forms a portion of the transistor current source. The voltage regulator means regulates the voltage across resistor R2, a member of the resistor ratio pair R1 and R2. The extent of regulation of the output voltage, $V_{out}$, is in proportion to a first ratio of the values of R1 to R4 multiplied by a second ratio of the values of R3 to R2. A desired resistor ratio is achieved because the first and fourth resistors, R1 and R4, on the one hand and the second and third resistors, R2 and R3, on the other hand have values which deviate from desired values by the same amount of "match", as defined earlier. This is because each of the resistors in the aforesaid ratios is made simultaneously using the same masking and diffusion steps. Therefore the expected deviation from a desired resistor value is the same in each. Not only will the expected deviations vary from desired values, but also deviations in widths and lengths will also be compensated using the invention described herein. For example, if a resistor having a peculiar shape is desired, it can be matched with another resistor of similar shape in the regulator. This pairing will help reduce the effect of any deviation of the first resistor from the desired shape because the paired resistor will be manufactured in the same process steps and thus the resistor values will be deviate from desired values by the same amount. The only requirement is that the paired resistors be manufactured simultaneously and have similar geometrical shapes, and similar dimensions. Unpaired resistors may have different dimensions, but paired resistors must be similar in shape and dimension as well as being manufactured simultaneously.

An advantage of providing such a voltage regulator is that the amount of current in the resistor R2 can be controlled and a physically smaller resistor made of a lower sheet resistivity diffusion may be used, thereby preserving critical integrated circuit space. Of course, additional resistors and active circuitry are needed for the regulator circuit, but often these can be added and still achieve a space-saving compared to what was previously needed, especially where a single regulator can supply the required regulated voltage to a large number of current source elements.

It may be readily seen that beyond apparatus, the present invention may be characterized as a method for constructing a desired resistor ratio for first and second resistors. A voltage regulator is provided between the first and second resistors wherein the regulator has internal third and fourth resistors with percentage errors from desired values. The method then consists of matching the first and fourth resistors in new ratios wherein the percentage error deviation from desired values of said first and fourth resistors is matched and the percentage error deviation from desired values of the third and second resistors is matched. The voltage across the first resistor has been regulated by the voltage regulator in proportion to the aforesaid two ratios. The method is most easily achieved by manufacturing the first and fourth resistors simultaneously of similar geometry and in one processing step of integrated circuit manufacture and manufacturing the third and second resistors simultaneously of similar geometry but in another processing step at a second time. Further, this regulator may include ratioing resistors manufactured using the same processing steps but with different physical geometries (i.e., short ratioed to long, thick ratioed to thin, crooked to straight, etc.).

What is claimed is:

1. A circuit for providing a desired resistor ratio comprising, first and second resistors forming a desired resistor ratio, said resistors having a transistor current source connected for supplying current to one of said first and second resistors and connected therebetween, said current source having control voltage input port, and voltage regulator means, including third and fourth resistors, connected to said control voltage input port for regulating the voltage across the other of said first and second resistors in proportion to a first ratio of the values of said third and second resistors multiplied by a second ratio of the values of said first and fourth resistors, said third and second resistors having values deviating from desired values by the same amount and said first and fourth resistors having values deviating from desired values by the same amount.

2. The apparatus of claim 1 wherein said voltage regulator means comprises first, second and third parallel circuit branches, each branch having an emitter therein, with the emitter of the first branch relatively scaled to provide a first current density therethrough which is greater than a second current density through the emitter in said second branch, said second branch including said third and fourth resistors with a third current density in the emitter of said third branch made equal to a corresponding fourth current density in an emitter in said transistor current source, wherein the voltage output of said regulator means is dependent on a voltage characteristic developed across a base-emitter junction associated with the emitter of the third circuit branch plus a voltage term associated with the ratio of said third resistor to said fourth resistor multiplied by the natural logarithm of the ratio of said first current density through said emitter in said first branch to said second current density in said emitter in said second branch.

3. The apparatus of claim 1 wherein said first and fourth resistors are matched resistors.

4. The apparatus of claim 1 wherein said third and second resistors are matched resistors.

5. The apparatus of claim 1 wherein said first and fourth resistors on the one hand and said third and second resistors on the other hand are matched resistors.

6. The apparatus of claim 1 wherein the product of said first and second ratios is $$(R_1/R_4) \cdot (R_3/R_2)$$

where
$R_1$ is said first resistor
$R_2$ is said second resistor
$R_3$ is said third resistor, and
$R_4$ is said fourth resistor.

7. A method for constructing a desired resistor ratio for first and second resistors, whose resistances include a percentage error from desired values comprising:

providing first and second resistors to form a resistor ratio, each resistor having a percentage error, providing a voltage regulator between said first and second resistors, said voltage regulator having third and fourth resistors therein with percentage errors from desired values, matching said first and fourth resistors, matching said third and second resistors, and regulating the voltage across said first resistor in proportion to a first ratio of the values of said first and fourth resistors multiplied by a second ratio of the values of said third and second resistors.

8. The method of claim 7 wherein matching of said first and fourth resistors is achieved by manufacturing said resistors simultaneously with similar geometries.

9. The method of claim 7 wherein matching of said third and second resistors is achieved by manufacturing said resistors simultaneously with similar geometries.

10. The method of claim 7 wherein matching of said first and fourth resistors is achieved by manufacturing said resistors simultaneously at one time and matching of said third and second resistors is achieved by manufacturing said resistors simultaneously at a second time.

* * * * *